United States Patent
Kang et al.

(10) Patent No.: US 10,577,718 B2
(45) Date of Patent: Mar. 3, 2020

(54) METHOD FOR MANUFACTURING SILICON SINGLE CRYSTAL INGOT, AND SILICON SINGLE CRYSTAL INGOT MANUFACTURED BY THE METHOD

(71) Applicant: SK Siltron Co., Ltd., Gumi-si, Gyeongsangbuk-do (KR)

(72) Inventors: Jong Min Kang, Gumi-si (KR); Do Won Song, Gumi-si (KR)

(73) Assignee: SK Siltron Co., Ltd., Gumi-si, Gyeongsangbuk-do (KR)

( * ) Notice: Subject to any disclaimer, the term of this patent is extended or adjusted under 35 U.S.C. 154(b) by 275 days.

(21) Appl. No.: 15/541,419

(22) PCT Filed: Jul. 10, 2015

(86) PCT No.: PCT/KR2015/007170
§ 371 (c)(1),
(2) Date: Jul. 3, 2017

(87) PCT Pub. No.: WO2016/111431
PCT Pub. Date: Jul. 14, 2016

(65) Prior Publication Data
US 2018/0002827 A1 Jan. 4, 2018

(30) Foreign Application Priority Data
Jan. 7, 2015 (KR) .................. 10-2015-0001776

(51) Int. Cl.
*C30B 15/00* (2006.01)
*C30B 15/20* (2006.01)
(Continued)

(52) U.S. Cl.
CPC ............ *C30B 15/203* (2013.01); *C30B 15/04* (2013.01); *C30B 15/20* (2013.01); *C30B 29/06* (2013.01)

(58) Field of Classification Search
CPC ....... C30B 15/00; C30B 15/005; C30B 15/14; C30B 15/16
See application file for complete search history.

(56) References Cited

U.S. PATENT DOCUMENTS

| | | | |
|---|---|---|---|
| 2003/0033972 A1* | 2/2003 | Javidi | ................... C30B 15/203 117/13 |
| 2011/0259260 A1* | 10/2011 | Takanashi | ............... C30B 15/20 117/15 |
| 2012/0006254 A1* | 1/2012 | Fujishiro | ............... C03B 19/095 117/13 |

FOREIGN PATENT DOCUMENTS

| CN | 1350602 | 5/2002 |
|---|---|---|
| JP | 10-029894 | 2/1998 |

(Continued)

OTHER PUBLICATIONS

Chinese Office Action dated Nov. 14, 2018 issued in Application No. 201580072689.1 (with English translation).

(Continued)

*Primary Examiner* — Robert M Kunemund
(74) *Attorney, Agent, or Firm* — KED & Associates LLP (57) ABSTRACT

An embodiment provides a method for manufacturing a silicon single crystal ingot by using a silicon single crystal growing apparatus comprising: a chamber; a crucible arranged inside the chamber and accommodating a molten silicon solution; a heater arranged outside the crucible so as to heat the crucible; a heat shielding part arranged inside the chamber; and a pulling part for pulling a single crystal growing from the molten silicon solution, wherein the method can comprise a step of respectively growing a neck part, a shoulder part and a body part.

5 Claims, 8 Drawing Sheets (51) Int. Cl.
C30B 29/06 (2006.01)
C30B 15/04 (2006.01)

(56) References Cited

FOREIGN PATENT DOCUMENTS

| | | |
|---|---|---|
| JP | H11-209196 | 8/1999 |
| JP | 2014-114189 | 6/2014 |
| KR | 10-0182796 | 4/1999 |
| KR | 10-2001-0105416 | 11/2001 |
| KR | 10-2009-0078234 | 7/2009 |
| KR | 10-2013-0104524 | 9/2013 |
| WO | WO 2014/091671 | 6/2014 |

OTHER PUBLICATIONS

International Search Report (with English Translation) and Written Opinion dated Oct. 16, 2015 issued in Application No. PCT/KR2015/007170.

\* cited by examiner

METHOD FOR MANUFACTURING SILICON SINGLE CRYSTAL INGOT, AND SILICON SINGLE CRYSTAL INGOT MANUFACTURED BY THE METHOD

CROSS-REFERENCE TO RELATED PATENT APPLICATIONS

This application is a U.S. National Stage Application under 35 U.S.C. § 371 of PCT Application No. PCT/KR2015/007170, filed Jul. 10, 2015, which claims priority to Korean Patent Application No. 10-2015-0001776, filed Jan. 7, 2015, whose entire disclosures are hereby incorporated by reference.

TECHNICAL FIELD

Embodiments relate to a silicon single crystal ingot having improved crystal quality at a shoulder part and a method for manufacturing the same.

BACKGROUND ART

In general, as methods for manufacturing silicon single crystals, a Floating Zone (FZ) method or a Czochralski (CZ) method are mainly used. If a silicon single ingot is grown using the FZ method, it may be difficult to manufacture a silicon wafer having a large diameter and thus process costs are very high. Therefore, silicon single crystal ingots are generally grown using the CZ method.

According to the CZ method, polycrystalline silicon is inserted into a quartz crucible and is melted by heating a graphite heating element, a seed crystal is immersed in an acquired molten silicon solution, crystallization occurs on a molten solution interface and, thus, the seed crystal is rotated and pulled up, thereby growing a single crystal silicon ingot.

In a single crystal growth process using the CZ method, a necking process in which a slim and long crystal is grown from the seed crystal is carried out, a shouldering process in which the crystal is grown in the diameter direction so as to have a desired diameter is carried out after the necking process and, then, a body growing process in which the crystal is grown to have a uniform diameter is carried out. After body growing up to a designated length has been completed, a tailing process in which the diameter of the crystal is slowly reduced so that the crystal is separated from the molten silicon solution is carried out.

Particularly, during silicon single growth, in the shouldering process in which the diameter of the single crystal is rapidly increased, a dislocation occurrence rate may be increased according to process conditions and, thus, optimization of pulling speed, temperature conditions of the molten silicon solution, etc. is required.

DISCLOSURE

Technical Problem

Embodiments provide a method for manufacturing a silicon single crystal ingot which may control the shape of a shoulder part so as to reduce dislocations in the shoulder part, and a silicon single crystal ingot manufactured by the method.

Technical Solution

In one embodiment, a method for manufacturing a silicon single crystal ingot using a silicon single crystal growth apparatus, including a chamber, a crucible arranged within the chamber and accommodating a molten silicon solution, a heater arranged outside the crucible so as to heat the crucible, a heat shielding part arranged inside the chamber, and a pulling part to pull a single crystal grown from the molten silicon solution, includes growing a neck part, growing a shoulder part and growing a body part, wherein growth of the shoulder part includes a first operation of decreasing a pulling speed of the shoulder part from a first pulling speed to a second pulling speed and decreasing a process temperature drop management value from a first management value to a second management value, and a second operation of maintaining the second pulling speed of the shoulder part and maintaining the second management value.

In another embodiment, a silicon single crystal ingot manufactured by the above-described silicon single crystal ingot manufacturing method includes a neck part, a shoulder part and a body part.

Advantageous Effects

A silicon single crystal ingot and a method for manufacturing the same in accordance with embodiments simultaneously change both a pulling speed of a single crystal and temperature conditions and may thus repeatedly reproduce the shape of a shoulder part and, thereby, a silicon single crystal ingot having improved quality and low frequency of occurrence of dislocations due to the repeatedly reproduced shape of the shoulder part may be acquired.

BEST MODE

Hereinafter, embodiments will be apparently described with reference to the annexed drawings and description. In the following description, a variety of specific elements such as constituent elements are shown. The description of such elements has been made only for a better understanding of the present invention. Those skilled in the art will appreciate that various modifications, additions, and substitutions to the specific elements are possible, without departing from the scope and spirit of the invention as disclosed in the accompanying claims.

In the following description of the embodiments, it will be understood that, when one element is referred to as being formed "on" or "under" another element, the two elements can directly contact or there may be one or more intervening elements disposed therebetween. In addition, it will also be understood that an expression "on" or "under" one element may include the downward direction as well as in upward direction of the element.

In the drawings, the thicknesses or sizes of respective layers may be exaggerated, omitted, or schematically illustrated for convenience and clarity of description. Further, the sizes of respective elements do not indicate actual sizes thereof.

Figure 1:
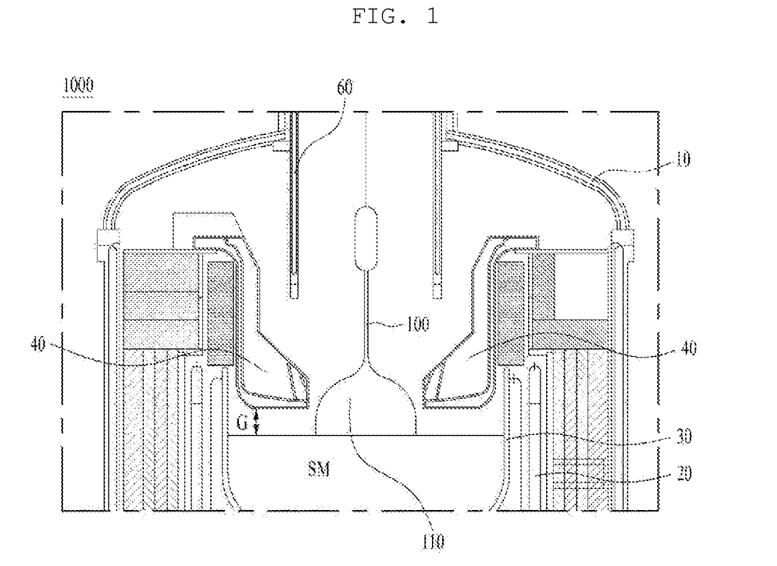
FIG. 1 is a view illustrating a silicon single crystal growth apparatus in accordance with one embodiment.

FIG. 1 is a view illustrating a silicon single crystal growth apparatus in which a method for manufacturing a silicon single crystal ingot in accordance with one embodiment is carried out.

The silicon single crystal growth apparatus 1000 in accordance with this embodiment includes a chamber 10, a crucible 30 to accommodate a molten silicon solution (SM), a heater 20 disposed at the outside of the crucible, a heat shielding part disposed in the chamber, a seed chuck to fix a seed (not shown) for growing a silicon single crystal ingot, and a pulling part (not shown) to move the silicon single crystal ingot upwards.

The chamber 10 may be formed to have a cylindrical shape provided with a cavity formed therein, and a pull chamber (not shown) may be disposed above the chamber 10 so as to communicate with the chamber 10.

The crucible 30 which accommodates the molten silicon solution (SM) may be disposed in the chamber 10. The crucible 30 may be disposed at the central region of the chamber 10 and have a generally concave container shape. Further, the crucible 30 may include a quartz crucible part directly contacting the molten silicon solution (SM) and a graphite crucible part surrounding the outer surface of the quartz crucible part and supporting the quartz crucible part.

The seed chuck may be disposed above the crucible 30. The seed chuck serves to fix a seed for growing a silicon single crystal ingot and may include the pulling part to pull an ingot grown during a single crystal ingot growth process upwards.

The heater 20 to supply heat to the crucible 30 may be disposed at the side of the crucible 30. The heater 20 may be spaced apart from the outer circumferential surface of the crucible 30 and disposed at the outside of the crucible 30, and the heater 20 may have a cylindrical shape so as to surround the side part of the crucible 30. Further, a water cooled tube 60 to cool the grown single crystal ingot may be disposed at the upper portion of the chamber 10.

The heat shielding part 40 may be disposed in the chamber 10 of the single crystal growth apparatus so as to conserve heat of the crucible 30 heated by the heater 20. The heat shielding part 40 may be disposed between the heater 20 and the chamber 10 and include an upper heat shielding part disposed at the upper part of the crucible 30, a side heat shielding part disposed on the side surface of the crucible 30 and a lower heat shielding part disposed at the lower part of the crucible 30, but disposition of the heat shielding part 40 is not limited thereto.

The heat shielding part 40 may be designed to have a shape using a material so as to achieve optimum thermal distribution in the heater 20 and the crucible 30 and to maximally use thermal energy without loss.

In manufacture of a silicon single crystal ingot using the silicon single crystal growth apparatus shown in FIG. 1, the silicon single crystal ingot may be continuously grown in order of a neck part, a shoulder part and a body part.

In the method for manufacturing a silicon single crystal ingot in accordance with this embodiment, growth of a shoulder part may include a first operation of decreasing the pulling speed of the shoulder part from a first pulling speed to a second pulling speed and decreasing a process temperature drop management value from a first management value to a second management value, and a second operation of maintaining the second pulling speed of the shoulder part and maintaining the second management value.

In the first operation of growth of the shoulder part, the pulling speed of the shoulder part may be gradually decreased as a process progress time passes. That is, as the height of the growing shoulder part increases, the pulling speed of the shoulder part may be decreased.

Further, in the first operation of growth of the shoulder part, a process management temperature may be continuously lowered, and the drop management value of the lowering temperature may be decreased as the process progress time passes.

In the second operation of growth of the shoulder part, the pulling speed of the shoulder part may be controlled so as to be uniformly maintained. Further, simultaneously, in the second operation, the process management temperature may be continuously lowered, but the drop management value of the lowering temperature may be controlled do as to be uniformly maintained.

Table 1 below states changes of the pulling speed and the process temperature drop management value as the process progress time passes during growth of the shoulder part.

TABLE 1

| Time (min) | Temperature drop management value (delta T) | Pulling speed (mm/min) | Ratio (pulling speed/delta T) |
|---|---|---|---|
| 0 | 35 | 0.88 | 0.025 |
| 6 | 26 | 0.87 | 0.033 |
| 12 | 22 | 0.85 | 0.039 |
| 18 | 20 | 0.84 | 0.042 |
| 24 | 18 | 0.83 | 0.046 |
| 30 | 18 | 0.82 | 0.046 |
| 36 | 18 | 0.81 | 0.045 |
| 42 | 18 | 0.80 | 0.044 |
| 48 | 18 | 0.80 | 0.044 |
| 54 | 18 | 0.80 | 0.044 |
| 60 | 18 | 0.80 | 0.044 |
| 66 | 18 | 0.80 | 0.044 |

With reference to Table 1, time indicates the process progress time during growth of the shoulder part, and temperature drop management value indicates a temperature control value during growth of the shoulder part, i.e., representing decrease in a temperature management value.

For example, simultaneously with growth of the shoulder part, the temperature management value is lowered by 35 points and, as a process progress time passes, the temperature management value is additionally lowered by 26 points, 22 points, and 20 points. Here, the shoulder part process temperature controlled by the temperature management value is continuously lowered, as time passes.

The temperature management value which is one of the process management values may be a temperature management value in an apparatus which controls growth of the shoulder part, i.e., a temperature management value of an Auto Temperature Controller (ATC). For example, change of 1 point may correspond to change of 0.5° C.

With reference to Table 1, for example, if a temperature at the start point of growth of the shoulder part is 1,800° C., decrease in the process temperature management value is 35 points at the initial stage of growth of the shoulder part, i.e., the temperature may be controlled to be lowered from 1,800° C. by 17.5° C.

Next, temperature drop of 26 points is additionally carried out and, thus, the temperature may be controlled to be further lowered by 13° C.

That is, the temperature drop management value of Table 1 may be a management value which continuously lowers a process temperature.

The pulling speed of Table 1 may be a pulling speed of the shoulder part.

The pulling speed of the shoulder part at the initial stage may be controlled to be decreased according to the process progress time and, after a designated time, the pulling speed may be maintained at a designated value.

For example, with reference to Table 1, the pulling speed of the shoulder part may be linearly decreased from 0.88 mm/min to 0.81 mm/min until 36 minutes from start of growth of the shoulder part passes. Further, in the growth process, after 36 minutes, the pulling speed may be maintained at 0.80 mm/min.

In Table 1, the first operation in which the pulling speed is decreased and the process temperature drop management value is decreased may be an operation until a process progress time of 24 minutes passes.

That is, a first pulling speed may be the pulling speed of the shoulder part before the pulling speed is uniformly maintained, i.e., be a value decreased as time passes, and a second pulling speed may be the pulling speed of the shoulder part which is uniformly maintained, for example, 0.80 mm/min in the embodiment disclosed in Table 1.

Further, as the process temperature drop management value, a first management value may be a temperature value which is decreased such that a temperature decrease degree is reduced as time passes, and a second management value, which is uniformly maintained, may be a management value in a section in which a temperature decrease degree is uniformly maintained.

The growth process carried out after 24 minutes, at which the second pulling speed is maintained and the second management value is maintained, may correspond to the second operation of growth of the shoulder part.

However, the pulling speed values and the temperature drop management values stated in Table 1 are only exemplary, and the pulling speed and the temperature drop management value in a method for manufacturing a silicon single crystal ingot in accordance with one embodiment are not limited thereto.

In Table 1, the ratio may be a value acquired by dividing the pulling speed by the temperature drop management value. That is, the ratio may be the pulling speed to change the temperature management value.

For example, if the temperature drop management value is defined as delta T, the ratio may correspond to (pulling speed)/(delta T).

With reference to results of Table 1, the ratio of the pulling speed to the change value of temperature tends to be gradually increased until the process progress time reaches 24 minutes, and the ratio tends to be uniformly maintained after 24 minutes.

Therefore, in the embodiment of Table 1, an operation until the process progress time reaches 24 minutes may correspond to the first operation of the growth process of the shoulder part and an operation after the process progress time of 24 minutes may correspond to the second operation of the growth process of the shoulder part.

That is, growth of the shoulder part may include the first operation in which a ratio value is gradually increased and the second operation in which the ratio value is uniformly maintained.

Figure 2:
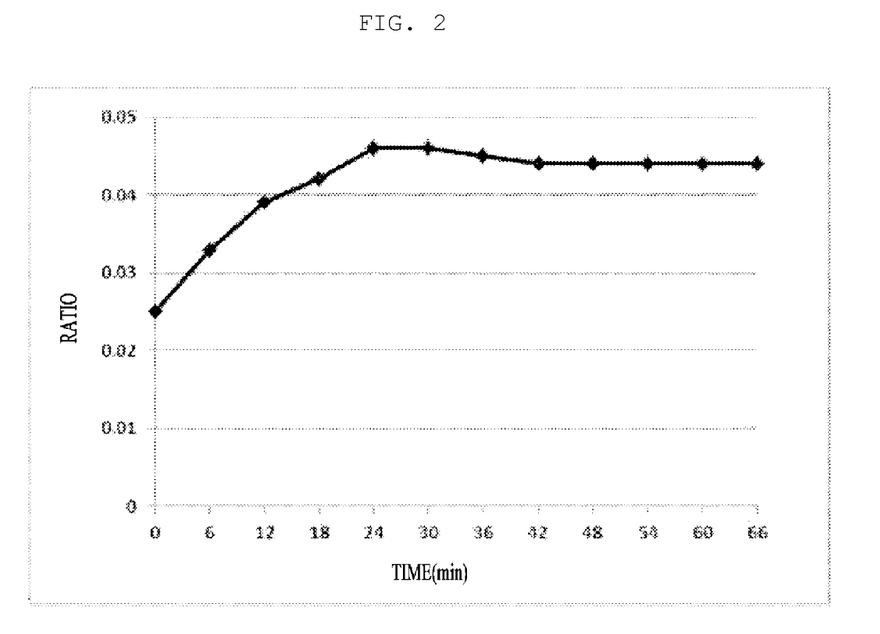
FIG. 2 is a graph illustrating the ratio of a process management value according to a growth process progress time of a shoulder part.

FIG. 2 is a graph representing the ratio (pulling speed/ delta T) value as time passes.

That is, with reference to results of Table 1 and FIG. 2, the ratio of the pulling speed to the process temperature drop management value in the first operation may be increased as the height of the shoulder part increases, and, for example, the ratio may be linearly increased as the height of the shoulder part increases.

Further, after a designated time passes, the ratio may be uniformly maintained regardless of the progress time of the growth process of the shoulder part.

Here, a point at which the increasing ratio value starts to be uniformly maintained may be a portion of the shoulder part in which single crystal growth in the horizontal direction is rapidly increased, for example, a portion of the shoulder part corresponding to the boundary between an upper shoulder part and a lower shoulder part of a silicon single crystal ingot in accordance with an embodiment, which will be described below.

In the method for manufacturing the silicon single crystal ingot in accordance with the above-described embodiment, growth of the shoulder part may include controlling a melt gap to be greater than 30 mm and less than 38 mm.

Referring again to FIG. 1, the melt gap G may be a gap between the heat shielding part 40 and the molten silicon solution SM.

In growth of the shoulder part, heat distribution at the edge of the shoulder part may be controlled by controlling the melt gap. For example, thermal stress at the edge of the shoulder part may be minimized by adjusting the melt gap G within the range of 30 mm to 38 mm.

Further, more particularly, the melt gap may be controlled within the range of 33 mm to 35 mm.

Figure 3:
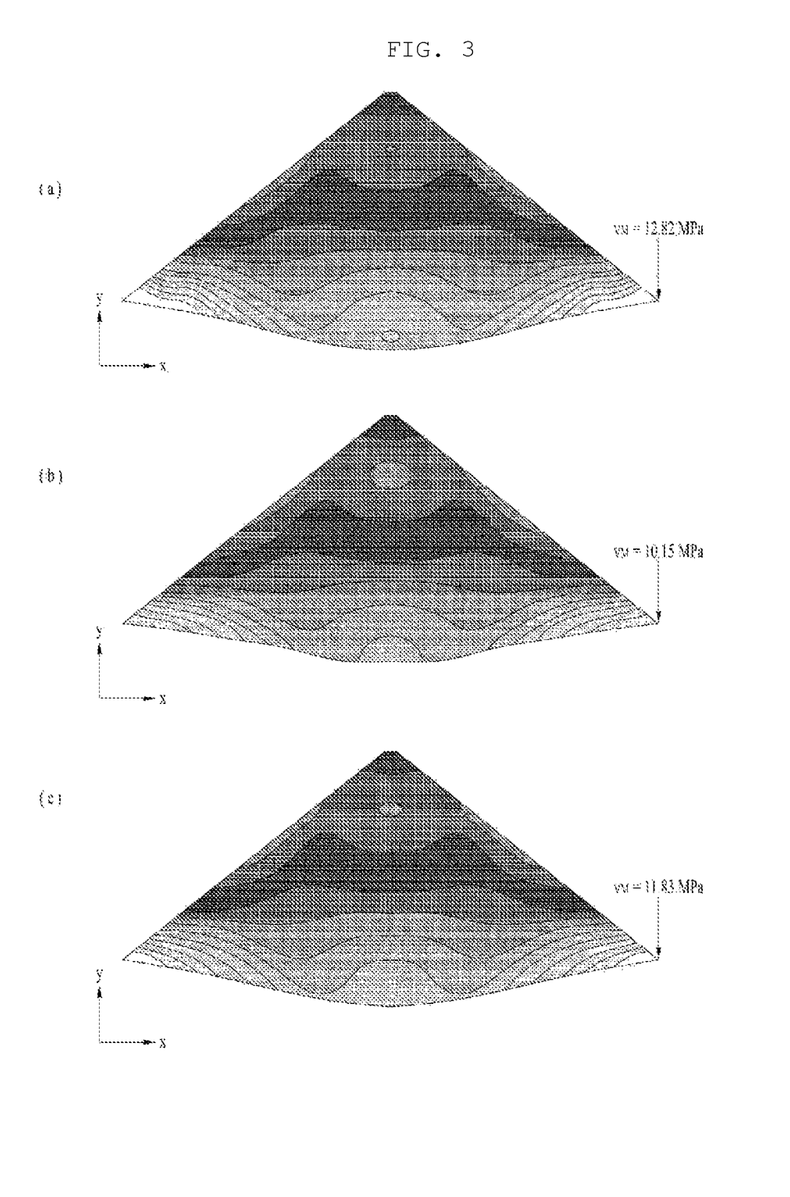
FIG. 3 is a view illustrating thermal stress distributions of the shoulder part according to melt gaps.

FIG. 3 is a view illustrating thermal stress distributions of the shoulder part.

In FIG. 3, (a) illustrates thermal stress distribution at the shoulder part if the melt gap is less than 30 mm, (b) illustrates thermal stress distribution at the shoulder part if the melt gap is 33 mm to 35 mm, and (c) illustrates thermal stress distribution at the shoulder part if the melt gap is greater than 38 mm.

With reference to FIG. 3, in case of (a) and (c) in which the melt gap is less than 30 mm or greater than 38 mm, thermal stress values of the shoulder part edge are respectively 12.82 MPa and 11.83 MPa, which are greater than that of (b), and this indicates that thermal distribution at the edge is dense.

That is, it may be understood that, in case of (b) of FIG. 3, the temperature distribution at the shoulder part is simple and the thermal stress value of the shoulder part is the lowest, i.e., 10.15 MPa.

Therefore, by adjusting the melt gap G within the range of 30 mm to 38 mm, thermal stress of the shoulder part may be reduced and thus crystal quality may be improved.

Hereinafter, silicon single crystal ingots in accordance with embodiments, manufactured by the above-described silicon single crystal ingot manufacturing method, will be described with reference to the accompanying drawings and a detailed description of parts which are substantially the same as those in the silicon single crystal ingot manufacturing method will be omitted because it is considered to be unnecessary.

Figure 4A:
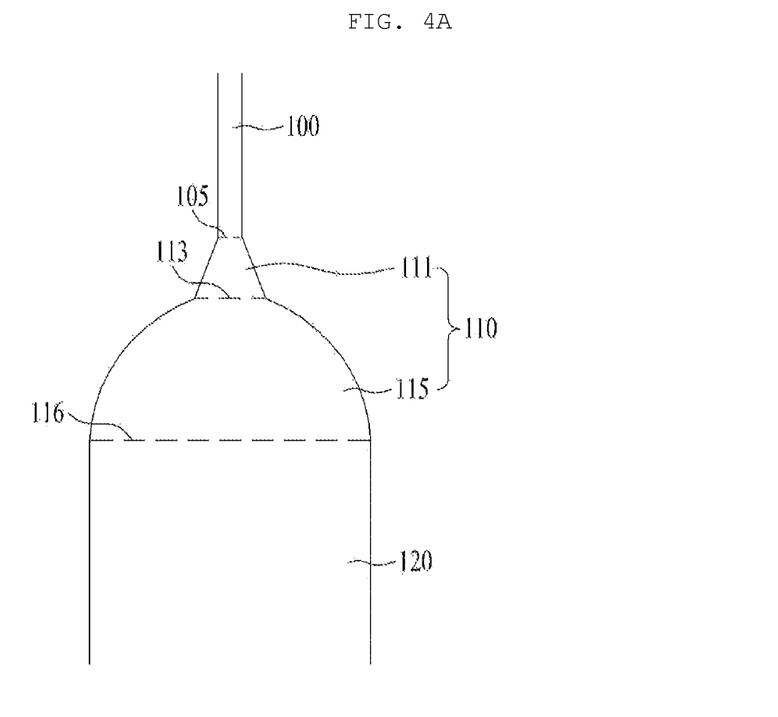
FIG. 4A is a view illustrating the configuration of a silicon single crystal ingot.

FIG. 4A is a view briefly illustrating the configuration of a silicon single crystal ingot.

With reference to FIG. 4A, the silicon single crystal ingot may include a neck part 100, a shoulder part 110 and a body part 120. That is, growth of the silicon single crystal ingot may start from the neck part and be carried out in order of the neck part, the shoulder part and the body part, as exemplarily shown in this figure.

In FIG. 4A, the diameter of a single crystal may be increased from a boundary 105 between the neck part and the shoulder part, the silicon single crystal having a uniform diameter may be grown starting from a boundary 116 between the shoulder part and the body part, and the shape of the side surface of the shoulder part may be changed at a boundary 113 between an upper shoulder part 111 and a lower shoulder part 115.

Figure 4B:
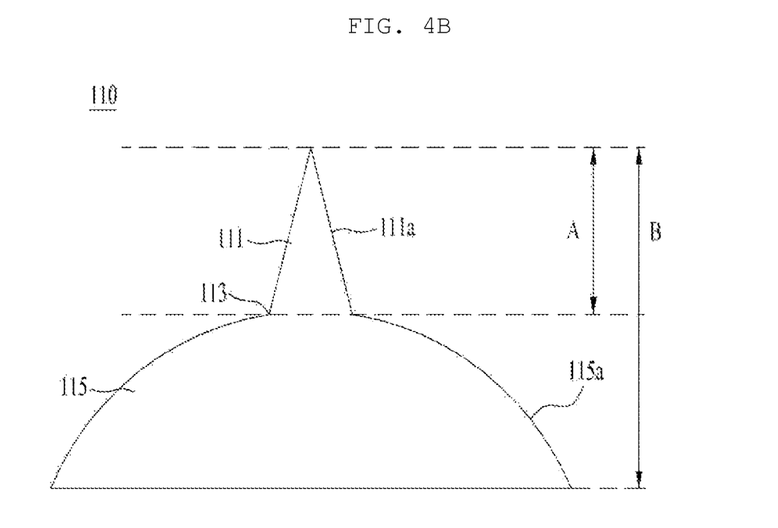
FIG. 4B is a view illustrating a shoulder part in accordance with one embodiment.

FIG. 4B is a view briefly illustrating the shoulder part 110 of the silicon single crystal ingot shown in FIG. 4A. For example, FIG. 4B may correspond to a cross-sectional view of the shoulder part, taken in the pulling direction.

With reference to FIG. 4B, the shoulder part 110 may include the upper shoulder part 111 and the lower shoulder part 115.

In the embodiment of FIG. 4B, the shoulder part may include the upper shoulder part 111 having a rectilinear side surface 111a and a diameter which is gradually increased in a direction toward the body part, and the lower shoulder part 115 extending from the upper shoulder part and having a curved side surface 115a having a convex shape and a diameter which is gradually increased in the direction toward the body part.

Further, the height A of the upper shoulder part may be 20% to 30% of the overall height B of the shoulder part.

In FIG. 4B, the cross-sectional shape of the upper shoulder part 111 may be a triangle in which two sides corresponding to the side surfaces of the shoulder part are symmetrical to each other, and the upper shoulder part may be manufactured to have a conical shape.

The diameter of the upper shoulder part 111 may be increased according to growth of the shoulder part. For example, the diameter of the upper shoulder part may be linearly increased according to increase in the height of the shoulder part.

That is, the side surface 111a of the upper shoulder part may be grown so as to be rectilinear.

The diameter of the lower shoulder part 115 may be gradually increased according to increase in the height of the shoulder part.

Further, the side surface 115a of the lower shoulder part may be curved, i.e., have an upwardly convex shape.

In FIG. 4B, the boundary 113 between the upper shoulder part and the lower shoulder part may be a portion in which the silicon single crystal is grown in the horizontal direction.

That is, if the growth direction of the silicon single crystal is the direction {100}, the boundary 113 between the upper shoulder part 111 and the lower shoulder part 115 may be a portion from which growth of the surface {111} of the silicon single crystal starts.

In FIG. 4B, the height A of the upper shoulder part may be 20% to 30% of the overall height B of the shoulder part, and such a ratio of the upper shoulder part may be controlled in the first operation of the above-described silicon single crystal ingot manufacturing method. For example, the height of the upper shoulder part may be controlled according to the progress time of the first operation in which the pulling speed is decreased and the temperature drop management value is gradually decreased.

In FIG. 4B, the curvature of the lower shoulder part may be controlled in the second operation of the above-described silicon single crystal ingot manufacturing method.

For example, in the operation in which the ratio of the pulling speed to the temperature drop management value is uniformly maintained, the lower shoulder part having a curved surface with a convex shape may be formed.

Figure 5A:
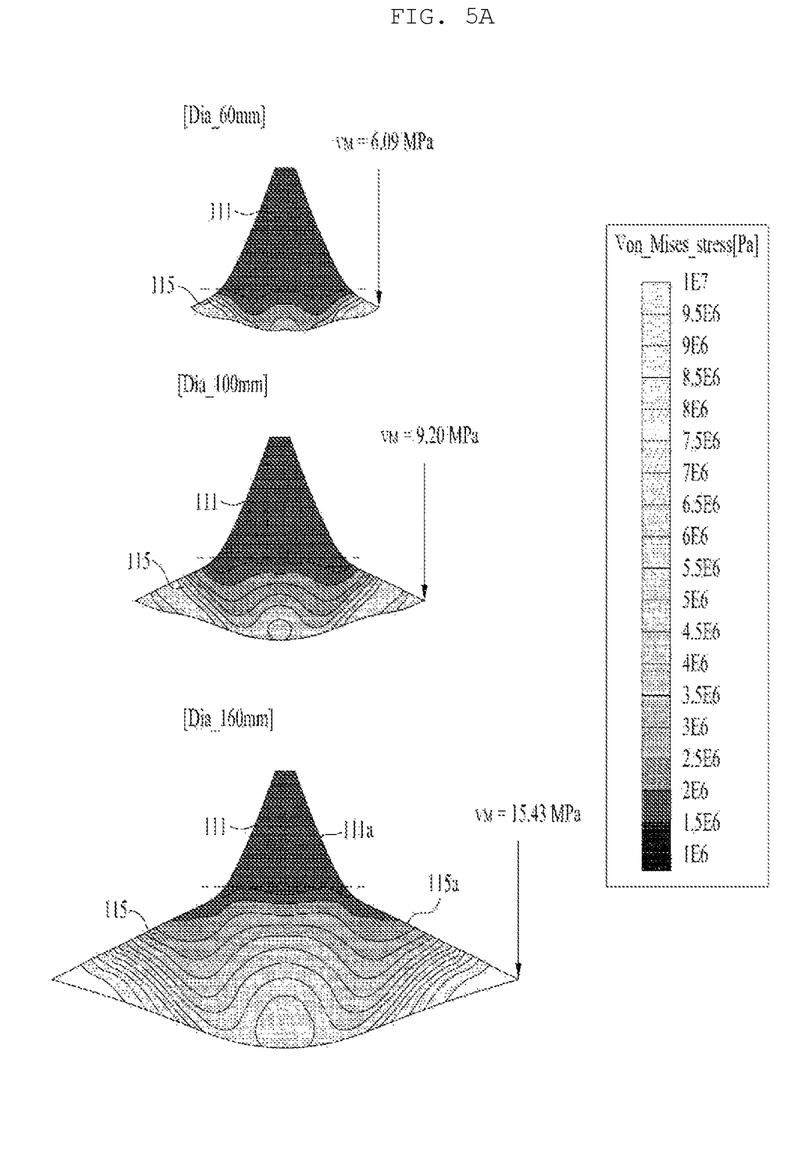
FIGS. 5A and 5B are views illustrating thermal stress distributions according to shapes of shoulder parts.
Figure 5B:
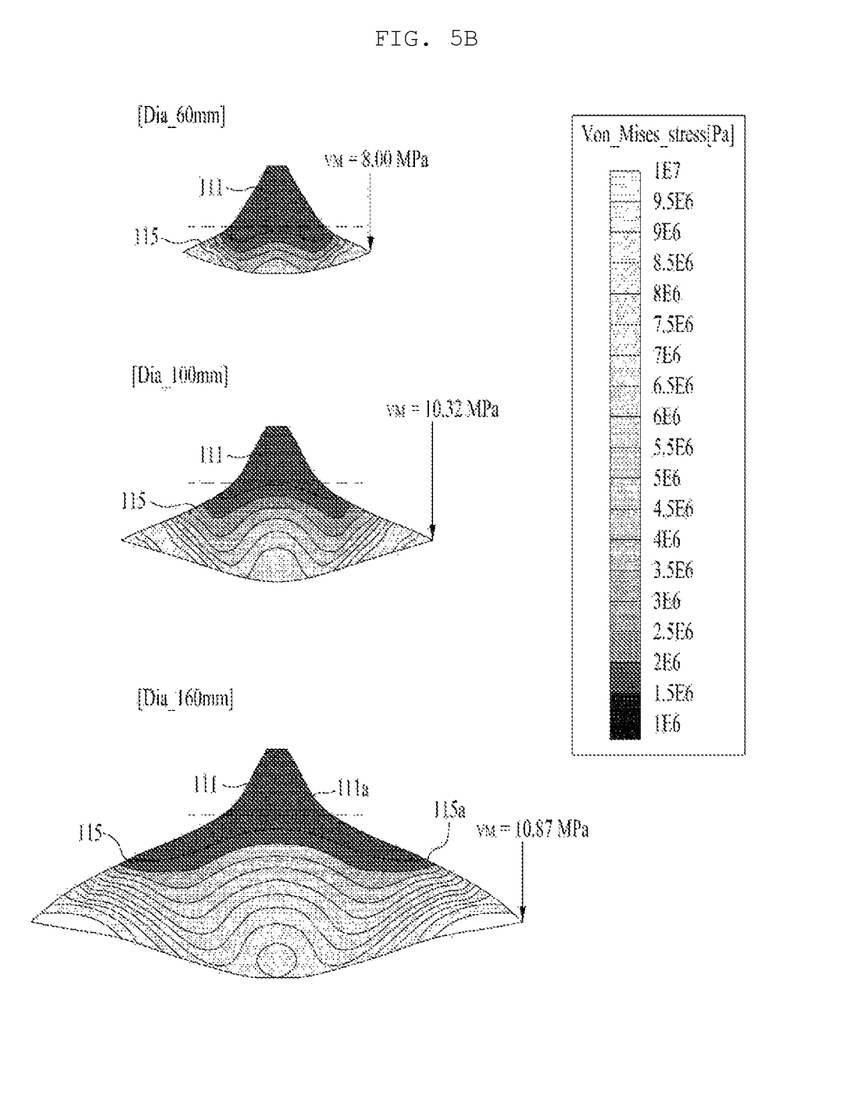

FIGS. 5A and 5B are views illustrating thermal stress distributions according to shapes of shoulder parts.

FIG. 5A illustrates shapes of a shoulder part, manufactured by a conventional method for manufacturing a silicon single crystal ingot in which only the pulling speed of the shoulder part is controlled, and thermal stress distributions therein.

In FIG. 5A, the shape of the shoulder part may be divided into an upper shoulder part 111 and a lower shoulder part 115 about a point (indicated in a dotted line) at which the gradient of the side surface of the shoulder part is changed, and a side surface 111a of the upper shoulder part and a side surface 115a of the lower shoulder part may be rectilinear.

Further, when the shoulder part having the shape of FIG. 5A is grown to have a diameter 160 mm, the edge of the shoulder part has a thermal stress value of 15.43 MPa.

FIG. 5B illustrates shapes of a shoulder part of a silicon single crystal ingot in accordance with one embodiment, manufactured by the above-described silicon single crystal ingot manufacturing method, and thermal stress distributions therein.

In FIG. 5B, the shoulder part may be divided into an upper shoulder part 111 and a lower shoulder part 115, and a side surface 115a of the lower shoulder part may be curved, i.e., have a convex shape. Further, when the shoulder part is grown to have a diameter 160 mm, the edge of the shoulder part has a thermal stress value of 10.87 MPa.

That is, the shoulder part in accordance with the embodiment shown in FIG. 5B, manufactured by controlling the pulling speed of the shoulder part and the temperature management value during the growth process of the shoulder part, may have the lower shoulder part having curvature and have a reduced thermal stress value, as compared to the conventional shoulder part shown in FIG. 5A.

The radius of curvature R of the curved surface forming the side surface of the lower shoulder part may be defined as below.

$$0.95D \leq R \leq 1.05D$$

Here, D corresponds to the diameter of a body part extending from the shoulder part.

Figure 6:
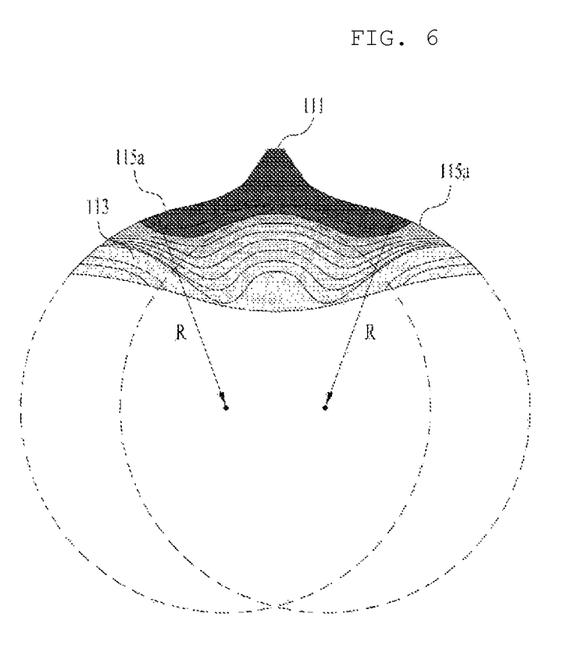
FIG. 6 is a view illustrating a shape of a shoulder part in accordance with one embodiment.

FIG. 6 is a view illustrating a radius of curvature of the side surface of the shape of a shoulder part in accordance with one embodiment.

In view of the cross-sectional shape of the shoulder part, a curved surface 115a having a convex shape forming both side surfaces of the shoulder part may overlap with parts of the circumferences of circles, which have different centers and use the radius of curvature R of the side surfaces as a radius thereof.

That is, the side surfaces 115a of the lower shoulder part may coincide with the circumferences of the circles having different centers and, in this case, the radiuses of curvatures of the respective side surfaces overlapping the circles having different centers may be equal.

Further, as is not shown in the drawings, in the cross-sectional view of the shoulder part, both side surfaces of the shoulder part may coincide with parts of the circumference of one circle having a center.

If the shoulder part shown in FIG. 6 serves to manufacture a body part having a diameter of 200 mm, the radius of curvature R of the side surface 115a of the lower shoulder part may be 195 mm to 205 mm.

For example, if the diameter of the body part exceeds 200 mm, the radius of curvature of the lower shoulder part may exceed 205 mm and, if the diameter of the body part is less than 200 mm, the radius of curvature of the lower shoulder part may be less than 195 mm.

Figure 7:
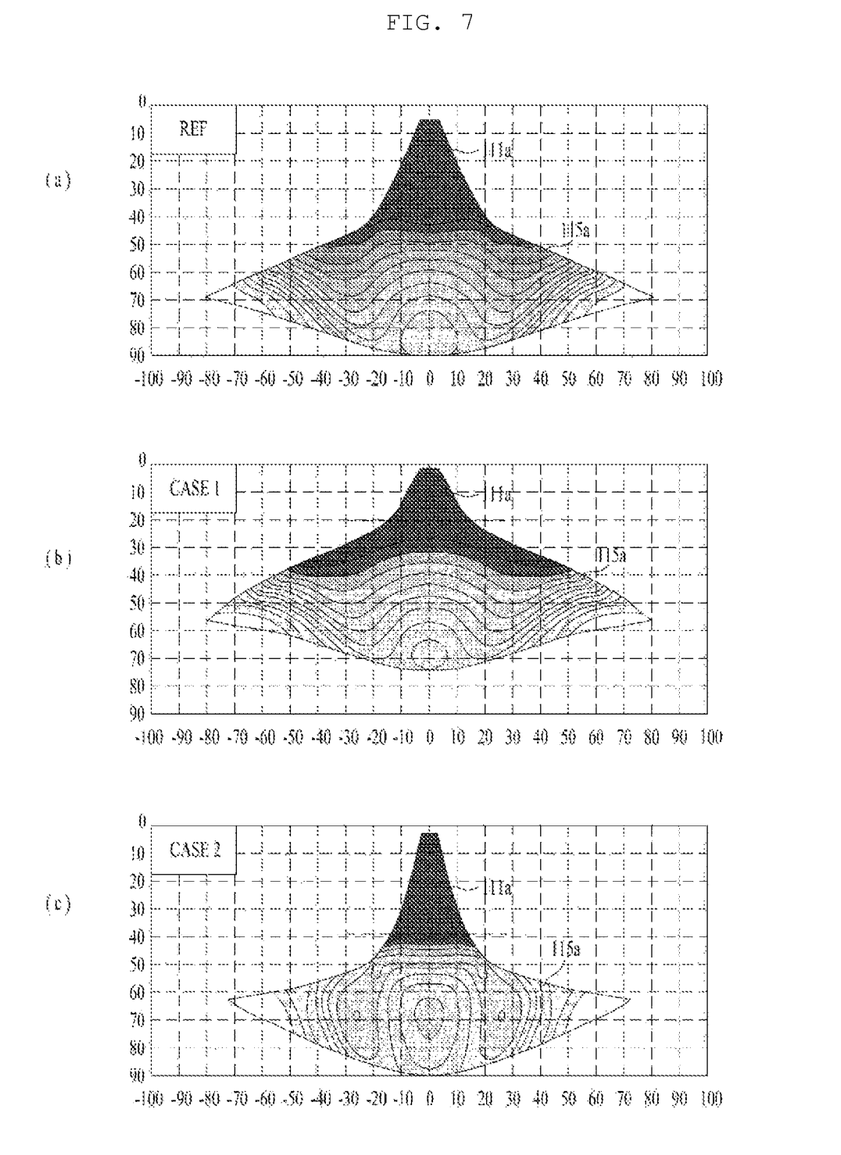
FIG. 7 is a view illustrating thermal stress distributions according to shapes of shoulder parts.

FIG. 7 is a view illustrating thermal stress distributions according to different shapes of shoulder parts.

In FIG. 7, the X-axis indicates the diameter of the shoulder part and both sides thereof are symmetrical about the origin of 0. Further, in FIG. 7, the Y-axis indicates the growth length of the shoulder part.

In FIG. 7, (a) illustrates a shoulder part in which the side surface 111a of an upper shoulder part and the side surface 115a of a lower shoulder part are rectilinear, (b) illustrates a shoulder part in which the side surface 111a of an upper shoulder part is rectilinear and the side surface 115a of a lower shoulder part is curved, i.e., convex, and (c) illustrates a shoulder part in which the side surface 111a of an upper shoulder part is rectilinear and the side surface 115a of a lower shoulder part is curved, i.e., concave.

Further, in case of FIG. 7(a) to (c), the ratio of the height of the upper shoulder part to the overall height of the shoulder part may be different. For example, in case of FIGS. 7(a) and (c), the ratio of the height of the upper shoulder part to the overall height of the shoulder part may be 40% to 50%, and in the case of FIG. 7(b), the ratio of the height of the upper shoulder part to the overall height of the shoulder part may be 20% to 30%.

Figure 8:
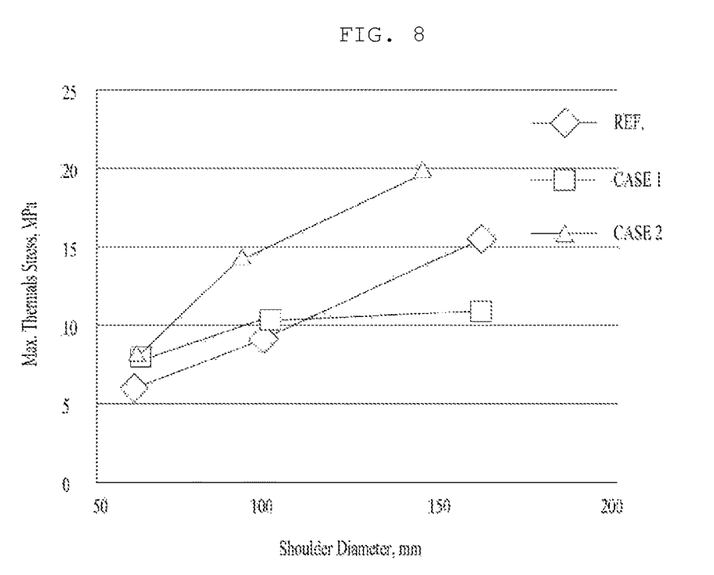
FIG. 8 is a graph illustrating thermal stress values according to shapes of shoulder parts.

FIG. 8 is a graph illustrating thermal stress change values according to growth of the shoulder parts in case of FIG. 7(a) to (c).

In FIG. 8, the X-axis corresponds to a diameter of the shoulder part, and the Y-axis corresponds to a thermal stress value.

In case of (a) expressed in "REF", thermal stress is gradually increased as the diameter of the shoulder part is increased, but, in case of (b) expressed in "CASE 1", thermal stress is higher than that of (a) up to a point where the diameter of the shoulder part reaches 100 mm but thermal stress is not almost raised but is maintained in a section from 100 mm to 150 mm, and thus thermal stress is reduced, as compared to (a).

On the other hand, it may be understood that, in case of (c) expressed in "CASE 2", a thermal stress value is the highest in all sections.

Therefore, in the silicon single crystal ingot in accordance with one embodiment in which the shape of the shoulder part is controlled, thermal stress within the shoulder part diameter range of 100 mm to 150 mm may be greater than 10 MPa and less than 15 MPa.

For example, if the diameter of the shoulder part including the lower shoulder part having a curved side surface with curvature is within the range of 100 mm to 150 mm, a thermal stress value at the edge of the shoulder part may be greater than 10 MPa and less than 12 MPa.

That is, it may be understood from results of FIGS. 7 and 8 that, if the lower shoulder part has a curved shape having an upwardly convex shape, thermal stress may be minimized and, thus, a silicon single crystal ingot having high quality may be manufactured.

Table 2 states frequencies of occurrence of dislocations in shoulder parts.

TABLE 2

| Division | Conventional shoulder part | Shoulder part of embodiment |
| --- | --- | --- |
| Frequency of occurrence of dislocations/lot | 0.84 | 0.35 |

With reference to Table 2, the frequency of occurrence of dislocations in a conventional shoulder part, the shape of which is not controlled, is 0.84 times/lot., but the frequency of occurrence of dislocations in the shoulder part in accordance with the above-described embodiment, in which the length ratio of the upper shoulder part and the curved shape of the lower shoulder part are controlled, is 0.35 times/lot., which is remarkably reduced as compared to the conventional shoulder part.

That is, the shoulder part in accordance with this embodiment, the shape of which is controlled, reduces the frequency of occurrence of dislocations and may thus improve crystal quality at the shoulder part.

Figure 9:
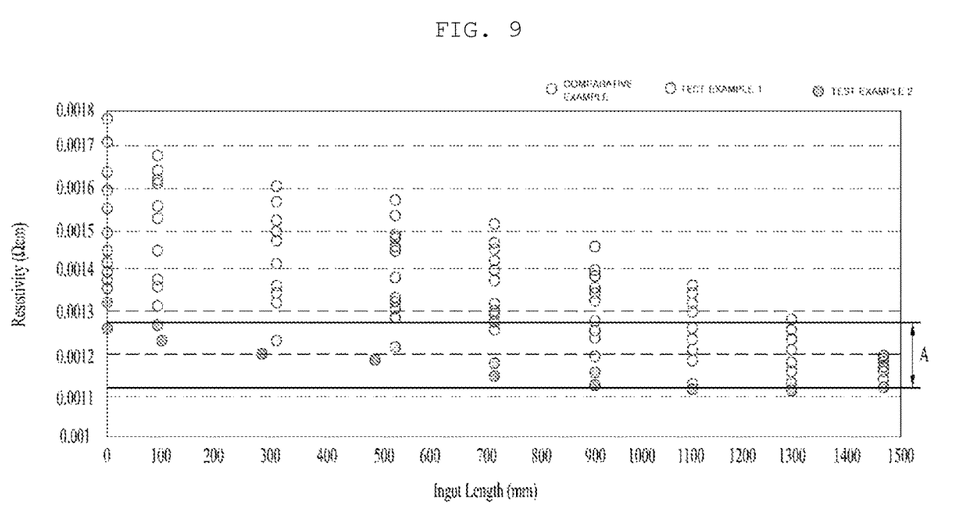
FIG. 9 is a graph illustrating distributions of resistivity values of body parts.

FIG. 9 is a graph illustrating distributions of resistivity values of body parts of silicon single crystal ingots.

In FIG. 9, in comparative example, a shoulder part is grown while not controlling the shape of the shoulder part only by adjusting a pulling speed during growth of the shoulder part and then a body part is grown. Thereafter, resistivity values of the body part are measured.

Further, in test example 1 and test example 2, a shoulder part is grown while controlling the shape of a lower shoulder part by adjusting a ratio of pulling speed to a temperature drop management value during growth of the shoulder part and then a body part is grown. Thereafter, resistivity values of the body part are measured.

In FIG. 9, the X-axis corresponds to the length of the body part.

In FIG. 9, section "A" is a section indicating low resistivity values, i.e., a region judged as having good resistivity values. With reference to FIG. 9, in test example 1 and test example 2, starting portions of the body parts have resistivity values which are within the section "A" and, thus, body part crystals having good quality may be acquired.

However, in case of comparative example, when the length of the body part is 1,400 mm or more, no resistivity value is within the section "A" and, thus, yield to produce a body part having good quality is low.

That is, as in the above-described embodiment, the shoulder part is divided into the upper shoulder part and the lower shoulder part such that the upper shoulder part occupies 20% to 30% of the overall shoulder part and the lower shoulder part is controlled so as to have a convex shape having curvature, thereby reducing occurrence of dislocations in the shoulder part and thus improving quality of the shoulder part, and further acquiring improved quality in a subsequent body part growth process.

A silicon single crystal ingot in accordance with one embodiment may include any one dopant selected from the group consisting of antimony (Sb), arsenic (As) and phosphorus (P).

For example, in a method for manufacturing a silicon single crystal ingot, any one of antimony (Sb), arsenic (As)

and phosphorus (P) at a high concentration may be added to a molten silicon solution as a dopant, and a silicon single crystal grown from the molten silicon solution including the dopant may be an N-type low-resistivity single crystal.

Here, the resistivity value of the grown silicon single crystal may be 0.05 Ωcm or less.

That is, if, even in a silicon single crystal ingot having low resistivity, the shape of a shoulder part is controlled as in the above-described embodiment, occurrence of dislocations in the shoulder part is suppressed and a silicon single crystal having high quality may be acquired.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A silicon single crystal ingot and a method for manufacturing the same in accordance with embodiments simultaneously change both a pulling speed of a single crystal and temperature conditions and may thus repeatedly reproduce a shape of a shoulder part, thereby being industrially applicable.

The invention claimed is:

1. A method for manufacturing a silicon single crystal ingot using a silicon single crystal growth apparatus comprising:
    a chamber;
    a crucible arranged within the chamber and accommodating a molten silicon solution;
    a heater arranged outside the crucible so as to heat the crucible;
    a heat shielding part arranged inside the chamber; and
    a pulling part to pull a single crystal grown from the molten silicon solution,
    the method comprising growing a neck part, growing a shoulder part and growing a body part,
    wherein growth of the shoulder part includes a growth of an upper shoulder part and a growth of a lower shoulder part,
    wherein the growth of the upper shoulder part includes a first operation of decreasing a pulling speed of the shoulder part from a first pulling speed to a second pulling speed and decreasing a process temperature drop management value from a first management value to a second management value,
    wherein the growth of the lower shoulder part includes a second operation of maintaining the second pulling speed of the shoulder part and maintaining the second management value,
    wherein a ratio value, based on the pulling speed and the process temperature drop management value, is gradually increased in the first operation, and the ratio value is uniformly maintained in the second operation, and
    the first management value is a temperature value decreased such that a temperature decrease degree is reduced as time passes, and the second management value is a management value in a section in which a temperature decrease degree is uniformly maintained.

2. The method according to claim 1, wherein, in the first operation, a ratio of the pulling speed of the shoulder part to the process temperature drop management value is increased as height of the shoulder part increases.

3. The method according to claim 2, wherein the ratio is linearly increased as the height of the shoulder part increases.

4. The method according to claim 1, wherein, in the second operation, a ratio of the pulling speed of the shoulder part to the process temperature drop management value is uniformly maintained.

5. The method according to claim 1, wherein growth of the shoulder part includes controlling a melt gap between the heat shielding part and the molten silicon solution to be greater than 30 mm and less than 38 mm.

* * * * *